United States Patent
Gray

[11] Patent Number: 5,815,514
[45] Date of Patent: *Sep. 29, 1998

[54] VARIABLE RATE BIT INSERTER FOR DIGITAL DATA STORAGE

[75] Inventor: Martin D. Gray, La Jolla, Calif.

[73] Assignee: Overland Data, Inc., San Diego, Calif.

[*] Notice: This patent issued on a continued prosecution application filed under 37 CFR 1.53(d), and is subject to the twenty year patent term provisions of 35 U.S.C. 154(a)(2).

[21] Appl. No.: 599,149

[22] Filed: Feb. 9, 1996

[51] Int. Cl.[6] .................................................. H03M 13/00
[52] U.S. Cl. ...................... 371/42; 371/37.1; 371/40.14; 341/58; 341/59
[58] Field of Search ........................... 371/42, 40.1, 37.4, 371/37.7, 37.1, 38.1, 40.14; 370/94.1; 395/182.03; 341/58, 59

[56] References Cited

U.S. PATENT DOCUMENTS

| | | | |
|---|---|---|---|
| 4,559,568 | 12/1985 | Watanabe et al. | 360/48 |
| 4,736,377 | 4/1988 | Bradlye et al. | 317/42 |
| 4,779,275 | 10/1988 | Yoshimoto | 371/42 |
| 4,862,457 | 8/1989 | Morimoto | 371/42 |
| 4,907,225 | 3/1990 | Gulick et al. | 370/94.1 |
| 4,908,826 | 3/1990 | Hertrich | 371/37.4 |
| 4,978,955 | 12/1990 | Howell | 341/109 |
| 4,993,029 | 2/1991 | Galbraith et al. | 371/40.14 |
| 5,014,274 | 5/1991 | Higurashi et al. | 371/40.1 |
| 5,068,878 | 11/1991 | Lin et al. | 375/362 |
| 5,109,385 | 4/1992 | Karp et al. | 371/42 |
| 5,172,381 | 12/1992 | Karp et al. | 371/42 |
| 5,222,139 | 6/1993 | Takaragi et al. | 380/28 |
| 5,528,607 | 6/1996 | Weng et al. | 371/42 |
| 5,570,379 | 10/1996 | Sasaki et al. | 371/42 |
| 5,579,324 | 11/1996 | Buhrgard | 371/42 |

FOREIGN PATENT DOCUMENTS

| | | |
|---|---|---|
| 0347934A2 | 12/1989 | European Pat. Off. . |
| 0 507 196 A2 | 10/1992 | European Pat. Off. . |
| 0511498A2 | 11/1992 | European Pat. Off. . |
| 0593173A2 | 4/1994 | European Pat. Off. . |
| 06124451 | 6/1994 | Japan . |
| 07111047 | 4/1995 | Japan . |
| WO06086 | 10/1987 | WIPO . |
| 0310057A2 | 4/1989 | WIPO . |
| WO 93/10534 | 5/1993 | WIPO . |
| WO9407332 | 3/1994 | WIPO . |

*Primary Examiner*—Reba I. Elmore
*Assistant Examiner*—McDieunel Marc
*Attorney, Agent, or Firm*—Knobbe, Martens, Olson & Bear, LLP

[57] ABSTRACT

A variable rate bit inserter is provided which efficiently encodes data prior to writing to a magnetic storage media. In a preferred embodiment, the bit insertion technique monitors the phase and amplitude content of the data stream and inserts appropriate bit patterns to ensure that phase and amplitude lock are maintained on the data stream for reading and decoding purposes.

14 Claims, 12 Drawing Sheets

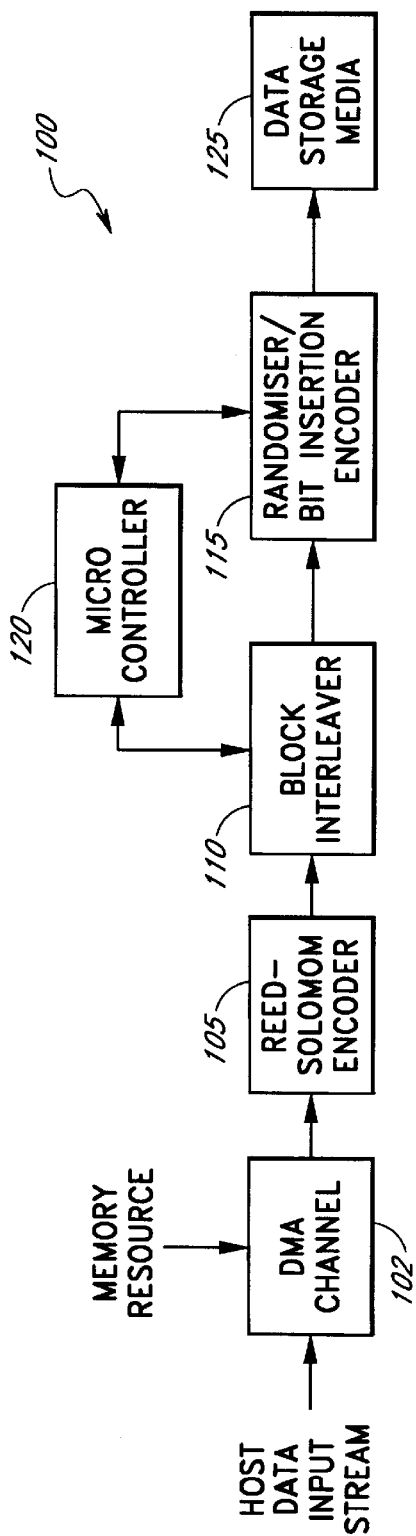
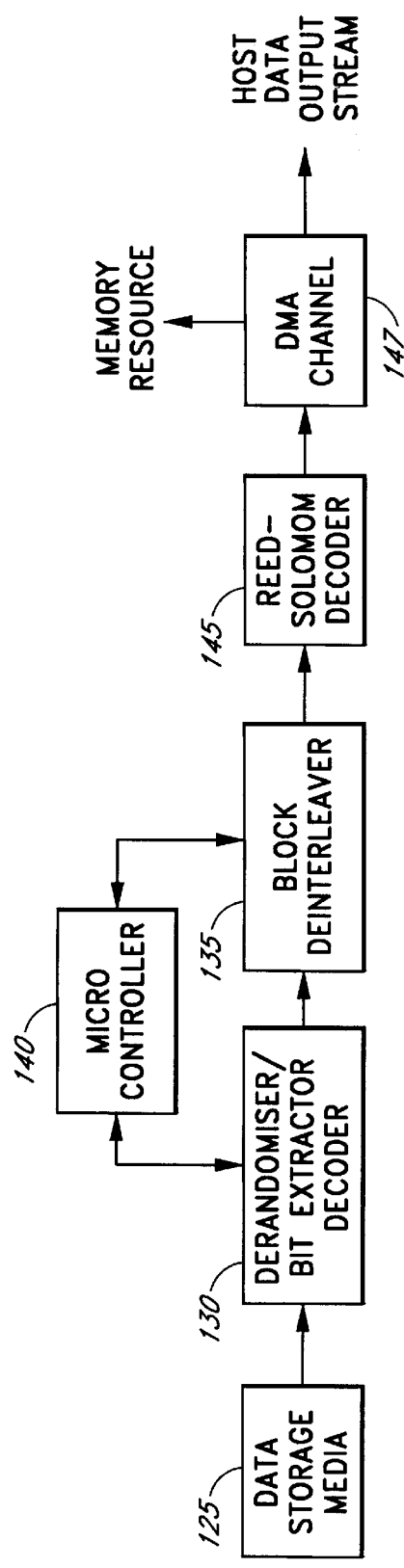
Fig. 1a
Fig. 1b

VARIABLE RATE BIT INSERTER FOR DIGITAL DATA STORAGE

BACKGROUND OF THE INVENTION

1. Field of the Invention

The present invention relates to a system and method for encoding data for storage on a magnetic or other data storage media and, in particular, to a variable rate bit insertion encoding system and method.

2. Description of the Related Art

Variable-rate bit insertion techniques are well known as a method for making a data stream robust against the detection of possible errors in the data stream. Typically, this method has application in the communication field, although variable rate bit insertion has been used in other applications, as is well known in the art. According to this technique, data bits are inserted into selected portions of a data stream where there is an increased likelihood that an error will be made in detecting the data bits accurately at this portion of the data stream. For example, variable-rate bit insertion may be used in a communications system where the receiving decoder is self-clocked. It is important that long strings of ones or zeros be broken up so that the phase locked loop at the detector side does not lose phase lock on the clock rate at which the data is being transmitted. This is particularly important in applications involving reading, for example, from magnetic tape since tape storage media typically have a very uncertain speed profile so that frequent clocking information is preferable to maintain phase lock. Thus, in such applications where it is desirable to maintain phase lock at the reading or receiving side, data bits are intentionally inserted into "trouble regions" within the output data stream so that at the detector side, sufficient information is present in the received data signal to maintain accurate phase lock on this data signal so that the data stream can be properly decoded.

Although the method of variable-rate bit insertion is desirable as an inexpensive and fairly simple method of increasing the robustness of data against errors, such a method has typically been found to be impractical in other applications. Most notably, variable-rate bit insertion has had limited applicability in the magnetic recording environment. Magnetic recording typically involves storage onto a tape or a disk, where data is stored to the magnetic tape or disk first and then read back. To provide for robust storage of data, variable rate bit insertion might be used to encode the data before writing to the magnetic media, and when the data is read back, the inserted bits would be detected and discarded. However, since the actual number of bits which are to be inserted is highly unpredictable, it is possible that the number of bits inserted would extend the length of the data stream by as much as 10 to 12 percent. Such an extension of the data stream is unacceptable for purposes of data storage, especially when it is desirable to maximize data storage efficiency. For example, if a particular data stream has characteristics such that a bit insertion is called for every 10 bits, then the amount of data to be stored onto the magnetic media will increase by 10 percent. This effectively makes a 500-megabyte storage media into a 450-megabyte storage media.

In an effort to transform the data stream into a form that is amenable to variable-rate bit insertion, the incoming data stream is first randomized using, for example, a pseudo-random noise code which is exclusive ORed with the incoming data stream to give the resulting output a random or pseudo-random character. This random character ensures that the probability of a data stream of being extended by more than 1 percent, for example, is statistically negligible. This is because bit insertion is typically performed to break-up regular patterns so that a substantially random pattern will require very few bit insertions. Thus, by randomizing the data before applying the variable-rate bit insertion techniques, such techniques can be more readily applied in applications involving data storage on magnetic or other data storage media.

It has been found, however, that in certain instances, when the incoming data pattern has a characteristic that correlates with the pseudo noise code (i.e., the randomizer polynomial) in such a way as to produce undesirable encoded characteristics (e.g., long strings of ones or zeros, or other redundant patterns), the randomization of the data stream using that particular randomizing polynomial does not act to prevent the length of the inserted data bits from being prohibitively long. A data stream having this characteristic is typically referred to as a degenerate pattern. Thus, when the incoming data stream is degenerate, variable-rate bit insertion techniques are not practical for use with magnetic storage or other data storage media. Furthermore, simply the possibility of such a degenerate data pattern has generally been considered as an impediment to the use of variable-rate bit insertion in the data storage environment.

In addition to the aforementioned shortcomings of variable-rate bit insertion in the data storage applications, it has been found that conventional techniques of variable-rate bit insertion do not always ensure that errors on the receive side associated with loss of phase information and automatic gain control are alleviated. For instance, if a detected data stream has characteristics such that a maximum swing in amplitude is not observed for a long period of time, this can cause the automatic gain control at the detection side to lose tracking, thereby introducing amplitude errors into the detected signal. Furthermore, loss of phase lock may result from data patterns other than consecutive strings of zeros and ones. Accordingly, simply inserting a bit in long strings of zeros and ones does not ensure that phase lock will be maintained in a self-clocking system at the decoding side. Thus, a need exists for an improved data encoding method which resolves the difficulties associated with variable-rate bit insertion in data storage applications and also accounts for receive-side errors associated with miscalibration of the automatic gain control or phase lock loop.

SUMMARY OF THE INVENTION

A system and method of data coding in accordance with the teachings of the preferred embodiment of the invention alleviates the aforementioned shortcomings associated with variable-rate bit insertion in data storage applications. In accordance with the present invention, rather than inserting only a single data bit during a variable-rate bit insertion technique, multiple bits that encode maximum phase and amplitude information are inserted into the data stream so that the information necessary for maintaining phase lock and for properly calibrating the automatic gain control during the read operation is always present within the recorded data stream. According to a particularly advantageous embodiment of this invention, four data bits are inserted upon each detection of a "trouble region" of the data stream.

In a preferred embodiment, the method of variable-rate bit insertion is combined with a configurable randomizer so that if it is determined that a particular pseudo-random randomizing code produces a degenerate data pattern, the randomizing polynomial can be reinitialized so that the randomizer is reconfigured. It has been found that if one pseudo-noise code produces a degenerate pattern, then another which is orthogonal to it, such as one in the same family, will not result in a degenerate data pattern. Thus, in a preferred embodiment, the reconfiguration of the randomizer to an orthogonal code ensures that a degenerate data pattern will not be produced by the randomizer.

BRIEF DESCRIPTION OF THE DRAWINGS

FIG. 1a and 1b are overall system diagrams that illustrate exemplary embodiments of a data encoder and a data decoder system, respectively, for coding data to be stored on a data storage media and decoding data which is read from the data storage media.

FIG. 2 is a simplified block diagram that illustrates the main functional elements of the randomizer/bit insertion encoder of FIG. 1a.

DETAILED DESCRIPTION OF THE PREFERRED EMBODIMENT

Figure 2:
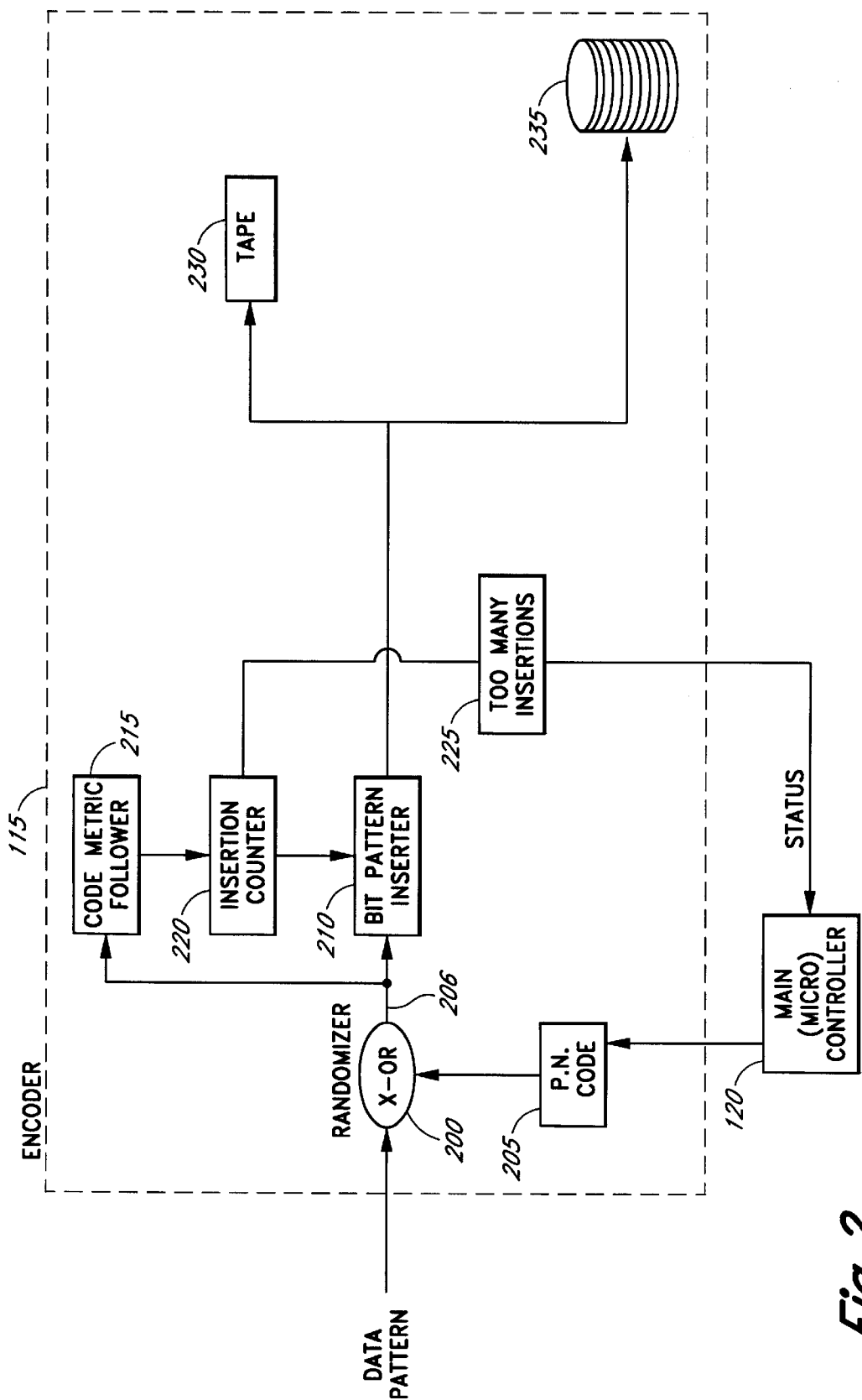

FIG. 1a is a highly simplified schematic block diagram that illustrates an exemplary data encoder system for use in encoding a data input stream for storage on a data storage media. As depicted in FIG. 1a, the system 100 includes a Reed-Solomon encoder 105, which receives the data input stream from a direct memory access (DMA) channel 102, which manages the flow of data in and out of the shared memory resources. Reed-Solomon encoding is well known in the art, and will not be described in detail herein.

Furthermore, it will be appreciated by those of ordinary skill in the art that the data input stream need not be encoded by a Reed-Solomon encoder. In practice, other forms of error encoding, such as trellis encoding, convolutional encoding, etc., may be used in the system of FIG. 1a as called for by the specific application. Once the data has been Reed-Solomon encoded within the Reed-Solomon encoder 105, the data is block interleaved within a block interleaver 110. As is well known in the art, a block interleaver typically comprises a matrix wherein the data stream is fed in by rows and read out by columns. By block interleaving the encoded data, errors which occur during a deep fade (i.e., when a long succession of data is lost due to Rayleigh fading effects) are distributed in smaller chunks throughout a larger portion of the data input stream so that within any given region, errors in the data are more likely to be recoverable. Once the data has been block interleaved, the data are input to a randomizer/bit-insertion encoder 115. In accordance with the preferred embodiment of the present invention, the custom randomizer/bit-insertion encoder 115 randomizes the incoming data stream with a configurable pseudo noise code, and thereafter inserts data bit patterns as necessary in order to make the randomized data stream robust against well-known detection errors such as the loss of phase lock or calibration on the automatic gain control (AGC) circuit on the decoding side. The randomizer/bit-insertion encoder 115 will be described in greater detail below with reference to FIG. 2.

Once the data has been randomized and bit insertion has taken place at the appropriate "trouble spots," the data is stored onto a data storage media 125 which, for example, may comprise a magnetic disk, a magnetic storage tape, or the like. The block interleaver 110 and the randomizer/bit-insertion encoder 115 both operate under the control of a microcontroller 120.

FIG. 1b is a highly simplified block diagram which shows an exemplary system used to decode data stored on the data storage media 125 when the data has been encoded by the system and method described with reference to FIG. 1a. As shown in FIG. 1b, data read from the data storage media 125 is fed into a derandomizer/bit-extractor decoder 130. The derandomizer/bit-extractor decoder 130 is described in greater detail below with reference to FIG. 3. The derandomizer/bit-extractor decoder 130 acts to essentially reverse the randomization and bit-insertion process performed within the randomizer/bit-insertion encoder 115. That is, the decoder 130 detects, extracts and discards the data bit patterns that were inserted within the encoder 115, and thereafter derandomizes the data to obtain the original data stream that was input to the randomizer/bit-insertion encoder 115.

Thereafter, the output of the derandomizer/bit-extractor decoder 130 is provided to a block deinterleaver 135, which reorders the interleaved blocks into their original order, as is well understood in the art. After the data has been deinterleaved within the block deinterleaver 135, this data is fed into a Reed-Solomon decoder 145. The Reed-Solomon decoder 145 acts to detect and correct errors within the output data stream. Once the data has been Reed-Solomon decoded, the output data stream from the Reed-Solomon decoder 145 should be a reconstruction of the data stream that was originally input to the Reed-Solomon encoder 105 for storage on the data storage media 125. A DMA channel 147 directs the flow of data to the appropriate memory resource. The derandomizer/bit-extractor decoder 130, the block deinterleaver 135, and the Reed-Solomon decoder 145 are all under the control of a microcontroller 140, which may, in one embodiment, be implemented as the same microprocessor as the microcontroller 120.

In the preferred embodiment, the microcontrollers 120, 140 enable/disable the encoder 115 and the decoder 130. Furthermore, the microprocessor monitors error status from the decoder 130 (e.g., CRC errors, insert extraction errors, etc.). The microprocessor further monitors the encoder 115 for excessive insertions and provides the correct randomizer seed for the encoder 115 and the decoder 130. In addition, the microprocessor creates header bytes for each block indicating address information for the Reed-Solomon decoder and the randomizer seed required for decoding. The microprocessor further invokes rewrites when a read-after-write error is detected. Finally, the microprocessor invokes a read retry when the capability of the Reed-Solomon encoder/decoder is exceeded as is well understood in the art. Each of the main operations of the microcontrollers 120, 140 will be described in greater detail below.

FIG. 2 is a schematic block diagram that illustrates the main functional elements of the randomizer/bit-insertion encoder 115 of FIG. 1a. As shown in FIG. 2, a data pattern input provided by the block interleaver 110 enters a randomizer 200. In one preferred embodiment, the randomizer 200 comprises an exclusive OR gate, which receives the input data pattern on a first input and receives a pseudo-random noise code on a second input via a second input from a pseudo-noise code generator 205. As will be described in greater detail below, the pseudo-noise code generator 205 comprises a shift register and adder configuration, which is defined by a randomizer polynomial, discussed in greater detail below. Of course, it will be appreciated that the randomization of data using a linear feedback shift register (LFSR) is well understood and conventional. By reinitializing the input values of the pseudo-noise code generator register, the pseudo-noise code that is generated by the generator 205 can be reconfigured so that the pseudo-noise code can easily be changed on the fly (e.g., in between data blocks).

The output of the randomizer 200 feeds to a bit pattern inserter 210, as well as a code metric follower 215. The code metric follower 215 provides an input to an insertion counter 220, which in turn provides an input to the bit pattern inserter 210, as well as to a bit-insertion threshold detector 225. The bit-insertion threshold detector 225 provides a status signal to the main microcontroller 120, which in turn provides a control signal to the pseudo-noise code generator 205.

The output of the bit pattern inserter 210 is provided to the data storage media. As shown in FIG. 2, the media may comprise a magnetic tape 230 or a magnetic disk 235. It will be appreciated by those of ordinary skill in the art that the bit pattern inserter 210 is typically connected to one or the other of the data storage media 230, 235, and is not typically connected to both simultaneously.

In operation, the data pattern from the interleaver 110 is exclusive ORed with the pseudo-noise code to produce an output data pattern on the line 206 with an essentially random data pattern distribution. As discussed briefly above, data patterns that have an essentially random characteristic (i.e., data distribution) are statistically ideal for minimizing the number of data bits which must be inserted to break up redundant patterns which increase the likelihood of a decoding error.

The randomized output over the line 206 is detected by the code metric follower 215, which determines whether or not the randomized data stream meets the three separate metric criteria defined in accordance with the present invention to minimize the likelihood of decoding error. The operation of the code metric follower 215 will be described in greater detail below with reference to FIGS. 4–7.

When the code metric follower 215 determines that a bit pattern is to be inserted within the randomizer data stream along the line 206, the insertion counter 220 is incremented, and the appropriate bit pattern is inserted by the bit pattern inserter 210. Although, in one preferred embodiment, the bit pattern inserted comprises a four-bit word, in practice, a single bit or, alternatively, a multiple bit word (i.e., having two, three or more bits) could be inserted as called for by the specific application. The method employed by the bit pattern inserter 210 to insert the appropriate bit pattern will be described in greater detail below with reference to FIGS. 4 and 8. Once the bit pattern is inserted, the data stream passes through a storage media for permanent storage. For example, the data stream may be written to the tape 230 or to the magnetic disc 235.

The insertion counter 220 keeps track of the number of bit patterns which are inserted into the data stream output by the bit pattern inserter 210. If too many insertions are detected within the insertion detector 225, this causes a signal to be transmitted to the micro controller 120. The micro controller 120 controls the pseudo-noise code generator 205 to reconfigure the pseudo-noise code output by the generator 205. The method by which the micro controller 120 modifies the pseudo-noise code output by the pseudo-noise code generator 205 will be described in greater detail below with reference to FIGS. 9 and 10.

Data written to either tape or disc can be encoded. As data is being written to the magnetic disc 235, if the disc sector size is exceeded due to variable rate encoding of the data written to the sector, the block is truncated at the end of the sector and the sector is overwritten with the same data randomized using a different randomizing code (i.e., seed).

In this manner, not only can a data pattern be randomized to reduce the number of bit insertions made on a data stream to be stored, but the randomizer code can be reconfigured on the fly so that, in the event that the original randomizer code is insufficient to produce the number of bit insertions under the tolerable amount, the subsequent randomizing code will result in a bit insertion frequency which is within the allowable limits for storage on a magnetic medium.

Figure 3:
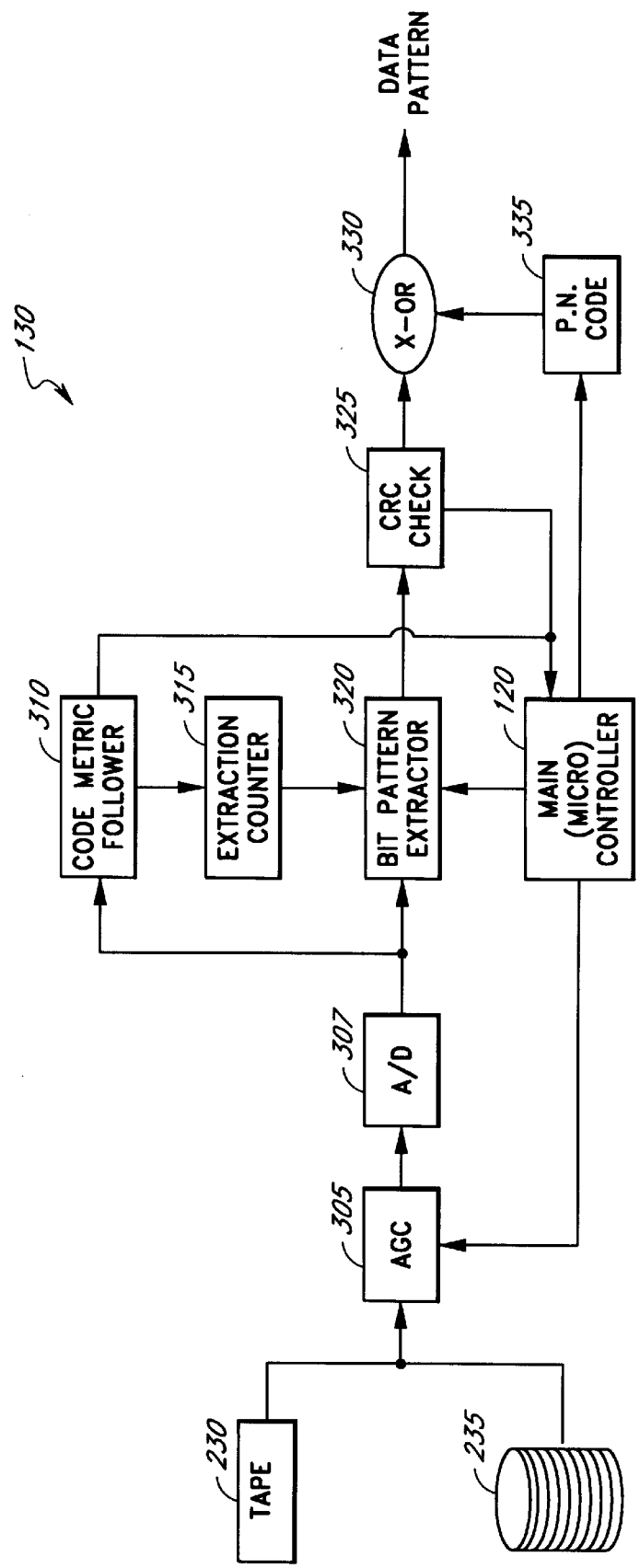
FIG. 3 is a simplified block diagram that illustrates the main functional elements of the derandomizer/bit extractor decoder of FIG. 1b.

FIG. 3 is a schematic block diagram which illustrates the main functional elements of the derandomizer/bit extractor decoder 130 of FIG. 1b. As shown in FIG. 3, data storage media such as the tape 230 or the disc 235 inputs data into an automatic gain control circuit 305 which automatically adjusts the amplitude of the incoming data stream to an appropriate level for monitoring by a code metric follower 310. An analog-to-digital convertor 307 is used to restore the analog signal output of the AGC circuit 305 to the digital bit stream written to the magnetic media. The code metric follower 310 operates in substantially the same manner as the code metric follower 215 of FIG. 2. The code metric follower 310 receives the data stream output by the A/D convertor circuit 307 and generates command signals to an extraction counter 315 as well as to the main micro controller 120. The input to the main micro controller 120 provides an indication to the micro controller 120 that a particular bit pattern detected within the data stream corresponds to an inserted bit pattern rather than to the natural bit pattern of the data. When the code metric follower in the decoder 310 detects a pattern that contains an insertion, the extraction counter 315 is notified. The extraction counter 315 removes the inserted data bits and at the same time verifies that the extracted bits are the correct polarity based upon the polarity of the previous two decoded bits, as described below with reference to FIG. 8. If the polarity is incorrect, an error status signal is generated to inform the microcontroller 140.

The bit pattern extractor 320 outputs the data stream through a cyclical redundancy code (CRC) check circuit 325. The CRC check circuit 325 verifies that the appropriate bits are extracted from the data stream and outputs a signal to the micro controller 120 if an error has been detected. When an error is detected by the CRC check circuit 325, the block is flagged as an erasure. In the subsequent Reed-Solomon decoder 145, the data which is tagged as an erasure is reconstructed using the correction capabilities provided by the Reed-Solomon decoder 145. As is well known in the art, Reed-Solomon encoding allows for error detection as well as correction. The proportion to the number of corrections to the number of detections can be varied depending upon the desired application. In the preferred embodiment of the invention, the Reed-Solomon encoder/decoder is set to perform the maximum number of corrections (i.e., to correct as many errors as are detected). This is because the detection of errors is advantageously performed using the CRC. In the event that more errors are detected than can be corrected, the microcontroller 140 requests a retransmission of the data. Once the data has been checked by the CRC check circuit 325, the data is once again exclusive ORed with the appropriate pseudo-noise code via a derandomizer circuit 330 (comprising an exclusive-OR gate in one advantageous embodiment) and a pseudo-noise code generator 335. The pseudo-noise code generator 335 receives instructions from the micro controller 120 indicating which pseudo-noise code is to be used to decode a given block of data via the derandomizer 330. As is well understood in the art, the information concerning which code to use for derandomization can be obtained from the header portion of the block of data, which is typically randomized using a fixed code rather than a variable code. Consequently, the same data pattern which was initially written for storage to the tape 230 or disc 235 is reproduced at the output of the exclusive-OR gate 330, and transferred to the block de-interleaver 135 (see FIG. 1b) for further processing.

Figure 4:
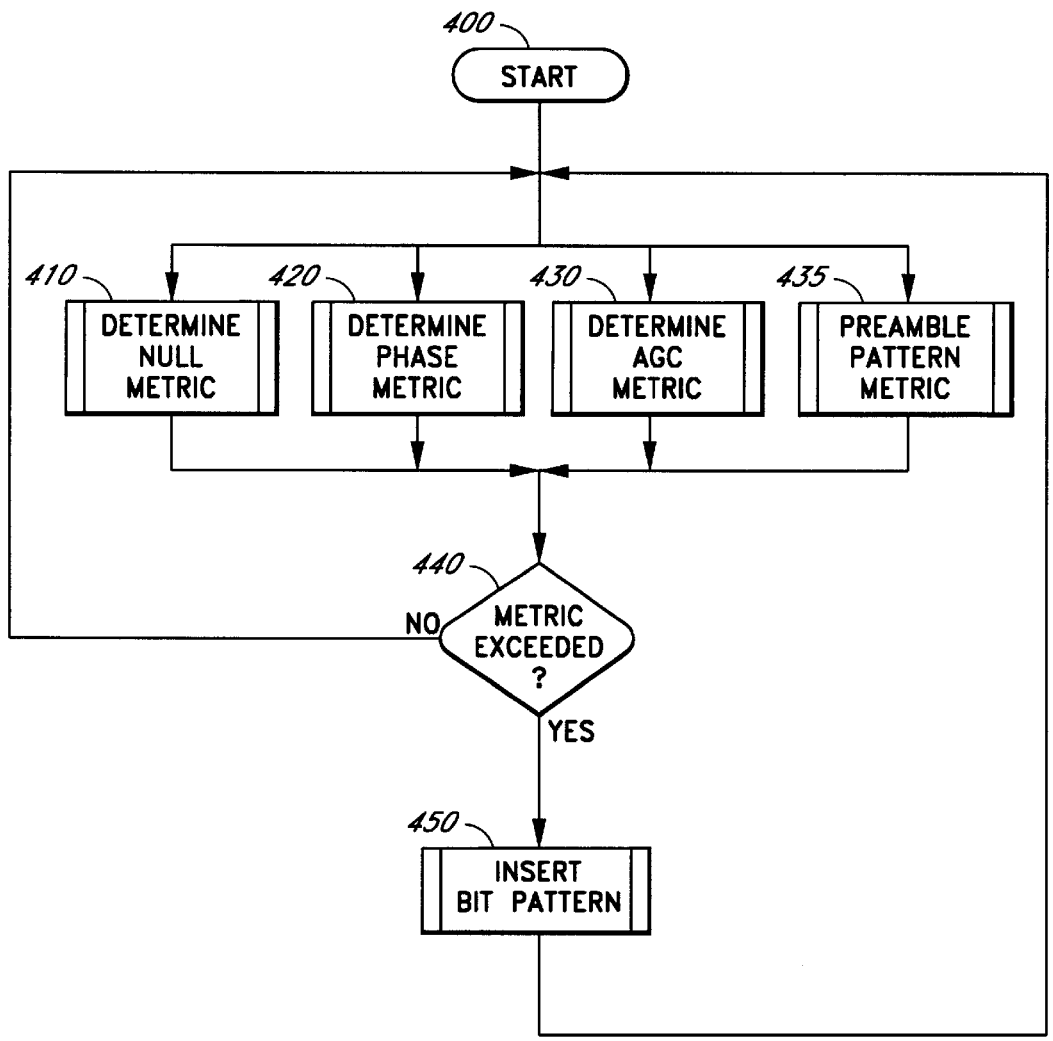
FIG. 4 is a flowchart that illustrates the general method used to insert a data bit pattern in accordance with the variable-rate encoding method of the present invention.

FIG. 4 is a flowchart that illustrates the general method used in accordance with the present invention to insert a data pattern in accordance with the variable-rate encoding method of the present invention. As depicted in FIG. 4, the method initiates, as represented by a start block 400, and enters four metric subroutine blocks 410, 420, 430, 435 for parallel processing to determine a null metric, a phase metric, an automatic gain control (AGC) metric, and a preamble pattern metric, respectively.

The null metric determined within the subroutine block 410, is used as a measure of consecutive zeros (commonly referred to as a null pattern) detected within the data stream. As discussed briefly above, when a null pattern persists within the data stream for an extended period, the effects can be deleterious on the decoding so that errors are more likely to occur. Thus, the subroutine block 410 tabulates the length of a null pattern and outputs a flag or a metric value indicative of a null pattern. The method used within the subroutine block 410 to determine the null method is described in greater detail below with reference FIG. 5.

As represented within the subroutine block 420, the phase metric of the incoming data stream is determined. The phase metric is an indication of the phase content of the data stream. As discussed briefly above, it is important for a data stream to contain adequate phase content since data decoding is based not only on amplitude, but on phase. Thus, a decoder may lose calibration if the phase content of the incoming data signal is sufficiently low that the phase decoder is unable to sufficiently recalibrate. This can result in inaccurate phase measurements made by the phase decoder. Thus, as a measure of the phase content of the incoming data stream, the subroutine block 420 outputs a phase metric value. The method employed within the subroutine block 420 is described in greater detail below with reference to FIG. 7.

As represented within the subroutine block 430, the automatic gain control (AGC) metric is determined. For purposes of accurately determining the amplitude at which the read signal should be input to the A/D converter 307 (FIG. 3), the automatic gain control circuit 305 must amplify the data stream from the magnetic media to the appropriate level. However, this AGC circuit 305 sometimes requires recalibration. This recalibration depends upon variations in the amplitude of a signal to determine the gain amplitude which the signal ought to have. Thus, it is particularly advantageous if the signal occasionally undergoes a maximum amplitude variation while reading the data pattern so that the AGC circuit 305 is able to recalibrate at the appropriate intervals. Thus, if the determination is made within the subroutine block 430 that a maximum amplitude variation has not occurred within a determined interval, then an AGC flag, or a measurement value indicating how long it has been since a maximum amplitude variation, is output by the subroutine block 430. The method employed within the subroutine block 430 to determine the AGC metric is described in greater detail below with reference to FIG. 6.

In one particularly advantageous embodiment of the invention, the code follower 215 is configured to monitor the header and data field portions of the data block in order to ensure that the preamble pattern is not reproduced outside of a preamble field. The monitoring for the preamble pattern is performed within the subroutine block 435. If it is determined that any 14 bit portion of the preamble has been reproduced elsewhere, then a flag is set which causes the bit inserter to insert a single bit at the end of this 14 bit sequence. In this case, the inserted bit is chosen to be the same as the second to last encoded bit, thereby ensuring that a preamble sequence is not recorded in the header or data fields of a block.

The metrics determined within the subroutine blocks 410, 420, 430, 435 serve as inputs to a decision block 440 which determines if any one of the null, phase or AGC metrics has been exceeded. In one advantageous embodiment, the subroutine blocks 410, 420, 430, 435 simply set flags to indicate that a metric threshold has been exceeded. If any one of the metrics has been exceeded, then a bit pattern is inserted into the data stream to compensate for the "trouble spot," as represented within a subroutine block 450 (see FIG. 8). However, if it is determined within the decision block 440 that the metric has not been exceeded, then the method returns to the inputs of the subroutine blocks 410, 420, 430, 435. The appropriate metric values are reset at the beginning of each new block of data.

Figure 5:
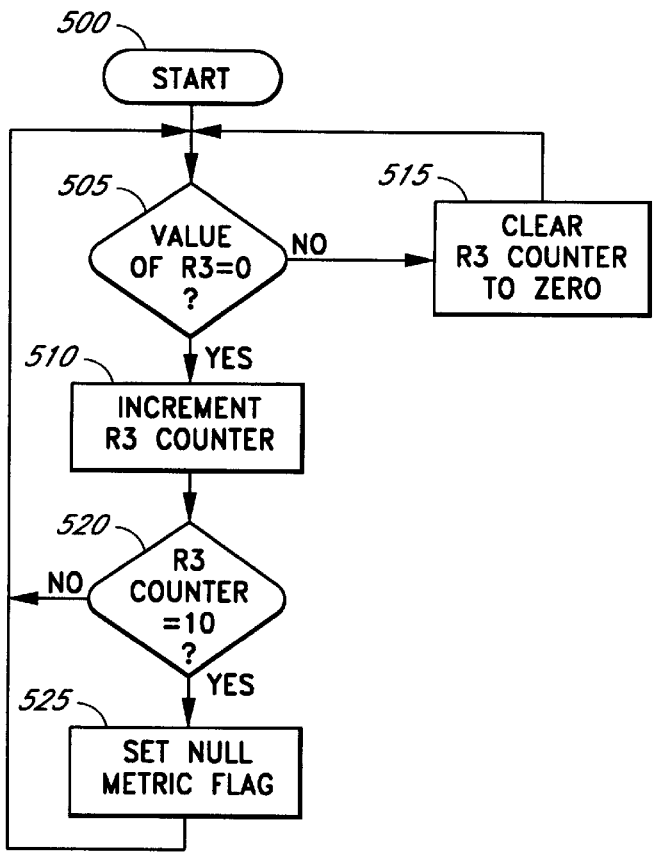
FIG. 5 is a flowchart that illustrates a submethod used to determine the null metric within the null metric subroutine block of FIG. 4.
Figure 12:
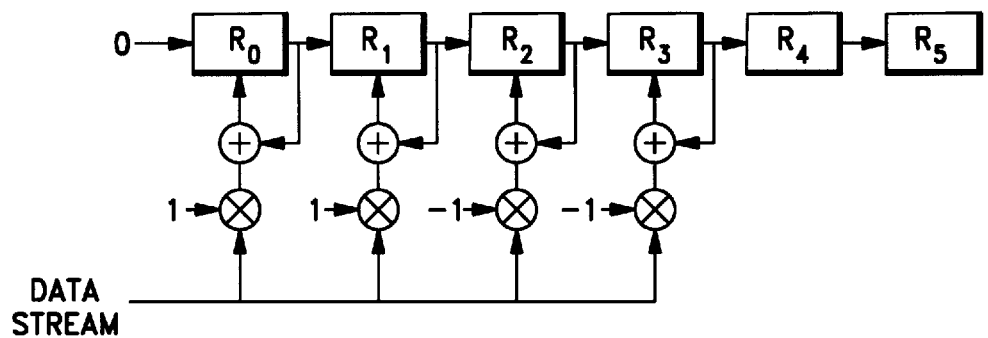
FIGS. 12–12d schematically illustrate the method used within a convolutional encoder to simulate the read-head impulse response in order to determine the null, phase, and automatic gain control metrics.

FIG. 5 illustrates a flow chart of the submethod used to determine the null metric within the null metric subroutine block of FIG. 4. The submethod begins as represented within a start block 500, and a determination is made if the value stored within register $R_3$ of the register-implemented impulse response simulator of FIG. 12 is equal to 0. As will be described in greater detail below with reference to FIGS. 12 through 12d, the impulse response of the read head used to read data from the magnetic storage media is simulated as a means of estimating the null, phase and AGC metrics. The value contained within the register $R_3$ is indicative of the duration of a null pattern so that the value contained within the register $R_3$ can be used to determine whether or not a bit pattern must be inserted to break up a null pattern.

If it is determined that the value contained within the register $R_3$ is equal to 0, as represented within the decision block 505, then a counter (i.e., an $R_3$ counter) is incremented, as represented within an activity block 510. However, if it is determined within the decision block 505 that the value stored within the register $R_3$ is not equal to 0, then the $R_3$ counter is cleared to 0, as represented within an activity block 515, and the method returns to the decision block 505.

Once the $R_3$ counter has been incremented, a further test is performed, as represented within a decision block 520, to determine if the value stored within the $R_3$ counter is equal to 10. If the value stored within the $R_3$ counter is not yet equal to 10, then this indicates that the null pattern is not sufficiently long to merit insertion of a bit pattern. However, if it is determined that the value stored within the $R_3$ counter is equal to 10, then this is an indication that the null pattern is of a sufficient length to require insertion of a bit pattern to break up the null pattern. Thus, if the value stored within the $R_3$ counter is less than 10, the method returns to the decision block 505; however, if the value stored within the $R_3$ counter is equal to 10, then a null metric flag is set to indicate that a bit pattern is to be inserted by the bit pattern inserter 210, as represented within an activity block 525.

Once the null metric flag has been set, as represented within the activity block 525 this indicates that an insertion will be made. The $R_3$ counter will then be automatically cleared to 0 when the inserted bit pattern is detected since this will cause $R_3$ to set to a non-zero value. The method then returns to monitor the value stored within the register $R_3$.

Figure 6:
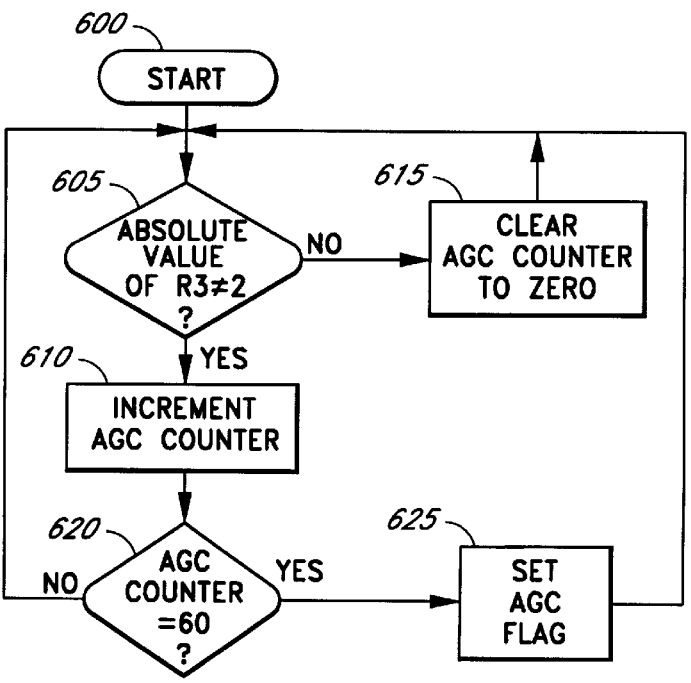
FIG. 6 is a flowchart that illustrates the general method used in accordance with the present invention to determine the automatic gain control metric within the gain control metric subroutine block of FIG. 4.

FIG. 6 is a flow chart which illustrates a general method used in accordance with the present invention to determine the automatic gain control metric within the gain control metric subroutine block of FIG. 4. The method begins, as represented within a start block 600, and a test is performed to determine if the absolute value stored within the register $R_3$ is not equal to 2, as represented within a decision block 605. As will be discussed in greater detail below, the value stored within the register $R_3$ may be used as a measure of read amplitude. Thus, if the absolute of the register $R_3$ is not equal to 2, then this indicates that the read amplitude has not exhibited a maximum variation in the positive or negative directions. Thus, there is a danger that the automatic gain control will be unable to accurately calibrate, since a maximum amplitude variation has not been observed by the automatic gain control circuitry. For this reason, the method of FIG. 6 keeps track of the number of clock cycles which transpire between maximum amplitude variations. To accomplish this, an automatic gain control counter is incremented, as represented within an activity block 610. However, if it was determined within the decision block 605 that the absolute value stored within the register $R_3$ was equal to 2, then this indicates that a maximum amplitude variation has been observed by the AGC circuitry so that the AGC counter is cleared to 0, as represented within an activity block 615. From the activity block 615, the method returns to the decision block 605, where the read amplitude is again monitored.

Once the AGC counter has been incremented, as represented within the activity block 610, a determination is made, as represented within a decision block 620, if the AGC counter has incremented up to a value of 60. A value of 60 stored within the AGC counter indicates that 60 clock cycles have transpired since the last maximum variation in amplitude, and it has been found that this number of clock cycles is a convenient number at which to insert an appropriate bit pattern for purposes of recalibrating the automatic gain control circuitry. Thus, as depicted in FIG. 6, if the AGC counter increments to a value of 60, then an AGC metric flag is set to indicate that the appropriate bit pattern is to be inserted, as represented within an activity block 625. If the AGC counter is not yet incremented to a value of 60, then the method returns to the decision block 605 to continue monitoring read amplitude variations via the value stored within the register $R_3$.

As will be described in greater detail below with reference to FIG. 8, in order to determine which bit pattern will be inserted into the data stream, as indicated within the activity block 625, the 2 bits within the data stream prior to the inserted bit pattern are monitored, and a bit pattern is selected in order to ensure that the combination of the input bit pattern and the prior 2 data bits in the data stream cooperate to produce a maximum amplitude variation. Once the AGC null metric flag has been set, this will cause the insertion of a bit pattern which will subsequently clear the AGC counter to 0, as represented within the activity block 615. In the meantime, the method resumes monitoring the simulated read amplitude.

Figure 7:
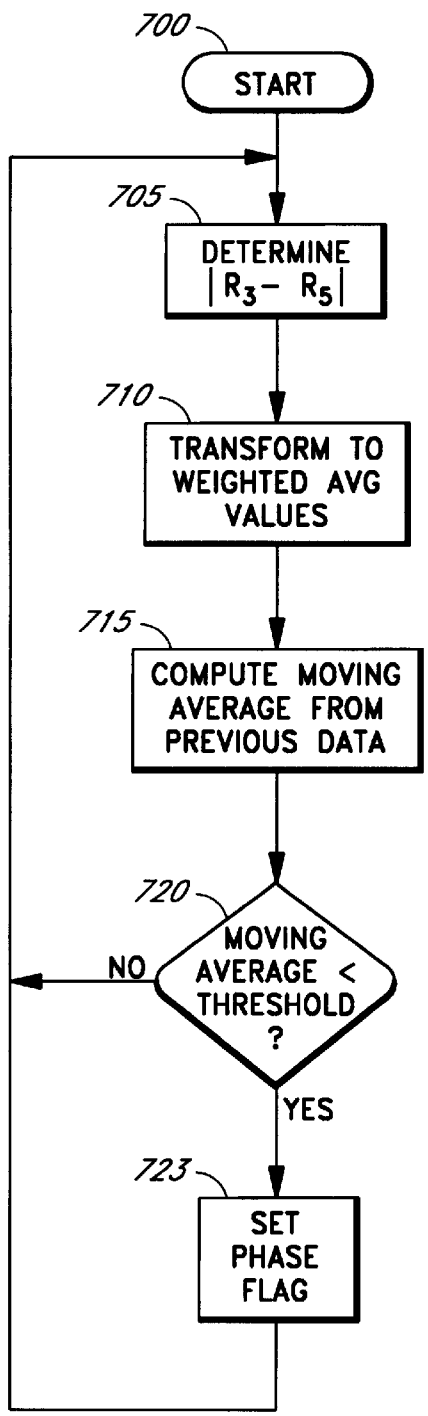
FIG. 7 is a flowchart that illustrates the method used in accordance with the present invention to determine the phase metric within the phase metric subroutine block of FIG. 4.

FIG. 7 is a flow chart which illustrates the method used in accordance with the present invention to determine the phase metric within the phase metric subroutine block of FIG. 4. The method initiates, as represented within a start block 700, and the absolute value of the difference between the value stored within the register $R_5$ and the $R_3$ of FIG. 12 is calculated, as represented within an activity block 705.

Thereafter, the value calculated within the activity block 705 is transformed into a weighted average value, as represented within an activity block 710. Since, in the embodiment described herein, the value calculated within the activity block 705 may be 0, 1, 2, 3 or 4, then the corresponding weighted average values are 0, 2, 4, 6 and 8. For example, if the value calculated within the activity block 705 is 3, then this value will be transformed to a value of 6 within the activity block 710, while if the value calculated within the activity block 705 is 4, then this value will be transformed to a value of 8 within the activity block 710.

Thereafter, as represented by an activity block 715, a moving average is computed from the weighted average values calculated for the all of the bits starting from the preamble of the data block which have been monitored for phase content. This moving average is recalculated each time a new value is calculated within the activity block 705. Advantageously, at the beginning of each data block, the average value is set to some number indicating near maximum phase content. As the moving average is calculated this value varies as determined by the actual phase content of the data stream. If this moving average falls beneath a certain threshold value, then this indicates that the data stream has a very low phase content, so that a bit pattern should be inserted to improve phase calibration. The reason for this is that the value stored within the register $R_5$ is a time delayed is version of the value stored within the register $R_3$. Thus, the difference between the values stored within the register $R_5$ and $R_3$ is a measure of the rate of change of the data stream at a sample time corresponding to the value stored within the register $R_4$. Thus, this differential value measures the phase content so that from this differential value, an indication can be made as to whether or not a bit pattern needs to be inserted in order to increase the phase content of the data stream.

Once the moving average has been calculated, a determination is made if this moving average is less than the threshold value, as represented within a decision block 720. In one advantageous embodiment, the threshold value is greater for the header field than for the data field (see FIG. 11), however, the actual values used for these threshold values may vary from application to application and may be determined as called for by the particular implementation. A phase metric flag is then set as represented within an activity block 723, and the method returns to monitor for phase content. In this manner, when a lack of phase content is detected within the data stream, a flag is set which causes a bit pattern to be inserted in order to increase the phase content of the data stream. However, if the moving average is above the threshold value, then the method reenters the activity block 705 to determine the next difference value.

Figure 8:
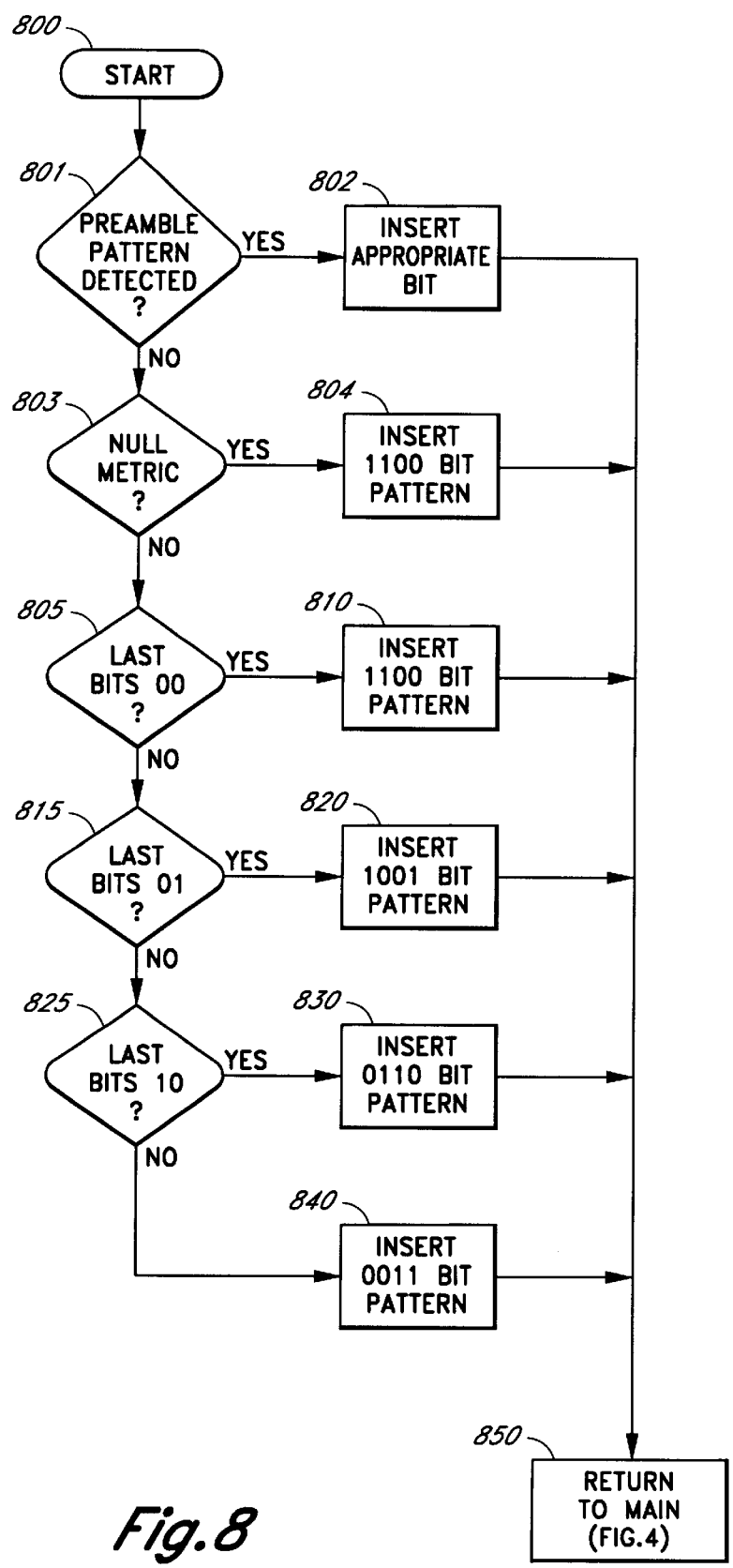
FIG. 8 is a flowchart that illustrates the submethod used within the insert bit pattern subroutine block of FIG. 4 to select and insert the appropriate bit pattern into the input data stream.

FIG. 8 is a flow chart which illustrates a submethod used within the insert bit pattern subroutine block of FIG. 4 to select and insert the appropriate bit pattern into the input data stream. The method initiates, as represented by start block 800, and a determination is made if the preamble pattern has been detected, as represented within a decision block 801. If the preamble pattern has been detected, then this causes the appropriate bit to be inserted into the data stream, as represented within an activity block 802. Otherwise, if the preamble pattern has not been detected, a determination is made if the flag which has been set is the null metric flag, as represented within a decision block 803. If the null metric flag has been set, then a bit pattern of "1100" is inserted into the data stream to break-up the null pattern, as represented within an activity block 804. The insertion of a data pattern of 1100 conveniently breaks up the null pattern, and also includes phase and amplitude information to provide for accurate phase and amplitude calibration. From the activity block 804, the method returns to the main method of FIG. 4.

If it is determined within the decision block 803 that the null metric flag has not been set, then a determination is made if the previous 2 bits in the data stream were "00," as represented within a decision block 805. If the last two bits were 00, then a bit pattern of 1100 is inserted into the data stream, as represented within an activity block 810, to produce a 6-bit pattern of "001100." However, if it is determined within the decision block 805 that the previous 2 data bits were not 00, then the method proceeds to determine if the last 2 bits were "01," as represented within a decision block 815. If the last 2 bits were 01, then a bit pattern of 1001 is inserted, as represented within an activity block 820, to produce a 6-bit data pattern of "011001." However, if the last 2 data bits in the data stream were not 01, then the method proceeds to a decision block 825, wherein a determination is made if the last 2 data bits were "10." If the last 2 data bits in the data stream were 10, then a data pattern of 0110 is inserted, as represented within an activity block 830, to produce a 6-bit data pattern of "100110." However, if the last 2 data bits were not 10, then this indicates that the last 2 data bits were 11, so that a data bit pattern of 0011 is inserted into the data stream, as represented within an activity block 840, to produce a 6-bit data pattern of "110011." It will be appreciated by those skilled in the art that the method of bit insertion described above ensures that maximum phase and amplitude information is inserted into the data stream to assist the phase locked loop and the AGC circuit so that phase lock and gain calibration are not lost.

Once the appropriate data bit pattern has been inserted within the activity blocks 810, 820, 830 or 840, then the method returns to the main method of FIG. 4, as represented within an activity block 850. In this manner, the method of the preferred embodiment ensures that the appropriate sufficient phase content will be inserted into the data stream to provide for accurate phase lock calibration. Furthermore, since the insertion of a 4-bit data pattern in accordance with the method of FIG. 8 will result in a maximum phase variation (i.e., $R_3-R_5=4$ or $-4$), and since this value is weighted so that a maximum phase variation will result in an even larger contribution to the moving average, one bit pattern insertion should be sufficient to raise the moving average well over the threshold level so that the bit pattern insertion obtains optimum phase content.

Figure 9:
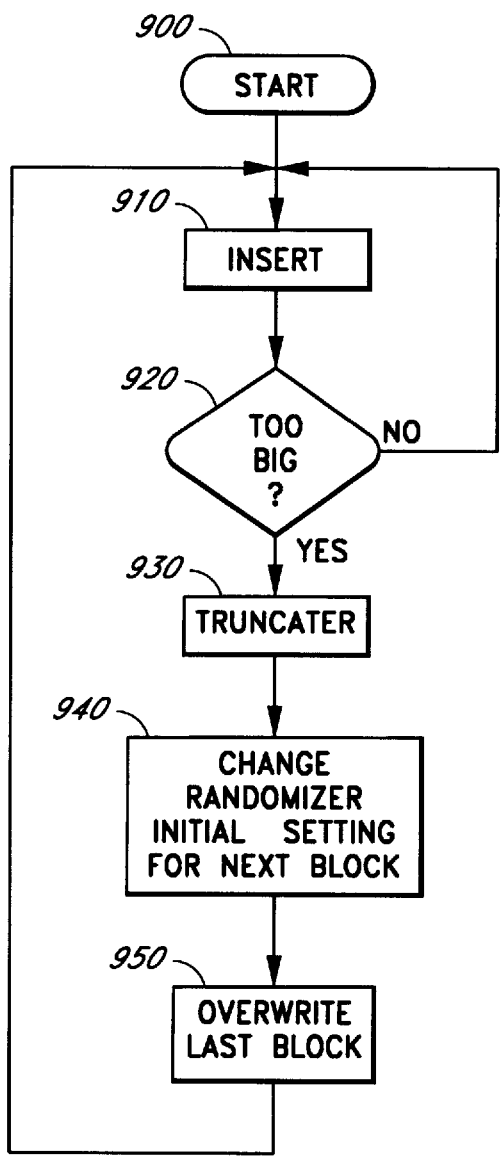
FIG. 9 is a flowchart that illustrates a general method used in accordance with the present invention to reconfigure the randomizer polynomial when data is to be stored to a magnetic disk.

FIG. 9 is a flow chart which illustrates the general method used in accordance with the present invention to reconfigure the randomizer polynomial when data is to be stored to a magnetic disk. The method initiates as represented within a start block 900 and thereafter, whenever a bit pattern is inserted into the data stream, as represented within an activity block 910, a determination is made whether the number of bits inserted is too large for a given block of data as represented within a decision block 920. In one embodiment, the number of insertions is tabulated, and if four times this number of insertions is greater than the number of bits which would cause the data block to be too large for storage onto the disk, a flag is set.

Thus, if it is determined that the number of insertions has not exceeded the threshold value, the method returns to the activity block 910 for tabulation of the next bit pattern insert. However, if it is determined that the threshold value has been exceeded within the decision block 920, the method proceeds to truncate the last data block as represented within an activity block 930. That is, the data block which is written to the disc is truncated so as not to exceed the sector size to which the data block is written. Thereafter, the randomizer initial settings for the next data block to be randomized are changed by the microcontroller 120, as represented within activity block 940. In one advantageous embodiment, the randomizer initial settings can be changed to settings for an orthogonal pseudo-noise code to that which was used on the last block of data.

The method used to reconfigure a randomizing polynomial to produce an orthogonal code is well known in the art. The reconfiguration to an orthogonal code ensures that the next block of data will not have a high correlation with the is new pseudo-noise code. This is because, orthogonal codes have an essentially zero correlation with one another so that, assuming that consecutive blocks of data have essentially the same bit pattern characteristic, when a bit pattern has a high correlation with a given pseudo-noise code, the same pattern will have a low correlation with a pseudo-noise code orthogonal to the original pseudo-noise code. Thus, by changing the randomizer initial settings for the next block of data so that the new pseudo-noise code is orthogonal to the last pseudo-noise code, the number of insertions for the data bit stream can always be reduced beneath the threshold required for storage onto the disk.

In one preferred embodiment, the randomizing polynomial used to generate the family of pseudo-noise codes used to randomize the data stream is:

$$g(x)=x^{24}+x^{21}+x^{19}+x^{18}+x^{17}+x^{16}+x^{15}+x^{14}+x^{13}+x^{10}+x^9+x^4+x^3+x+1$$

Finally, after the randomizer initial setting has been changed, the last block of data, for which a number of insertions was too high, is overwritten using the new pseudo-noise code as represented within an activity block 950. All subsequent data blocks are also randomized using the new pseudo-noise code. It should be noted that in the case of the disk storage, it is possible to change the randomizer polynomial coefficients on the fly and to overwrite the last data block because of the characteristics of a disk storage media which allow for overwrite on the fly. Thus, in accordance with the method of FIG. 9, data can be written to a disk drive without the danger that such data will be too large for storage purposes since changing of the randomizer polynomial on the fly will ensure that the percent increase for a given data block will never exceed the sector space allocated for storage to the magnetic disk.

It should be noted here, that in certain instances data has been encoded in such a way as to anticipate changes in a randomizer polynomial (i.e., with the specific intent of producing a degenerate pattern) so that if a straightforward method of changing the randomizer polynomial coefficient is used, it is still possible that such data streams will require an unacceptable number of bit is insertions. Thus, in accordance with a preferred embodiment, the method of changing the randomizer polynomials is itself pseudo-random or non-deterministic so that data streams which are intentionally encoded to frustrate data storage in this method may still be randomized in such a way so as to reduce the number of bit insertions to a tolerable level. As is well known in the art, a number of mutually orthogonal codes are associated within a family of codes defined by the randomizer polynomial. Thus, any one of the codes orthogonal to the code used last could be randomly chosen as the next randomizer seed. Alternatively, a complex, non-repetitive pattern for choosing consecutive codes could also be used, as called for by the particular application.

Figure 10:
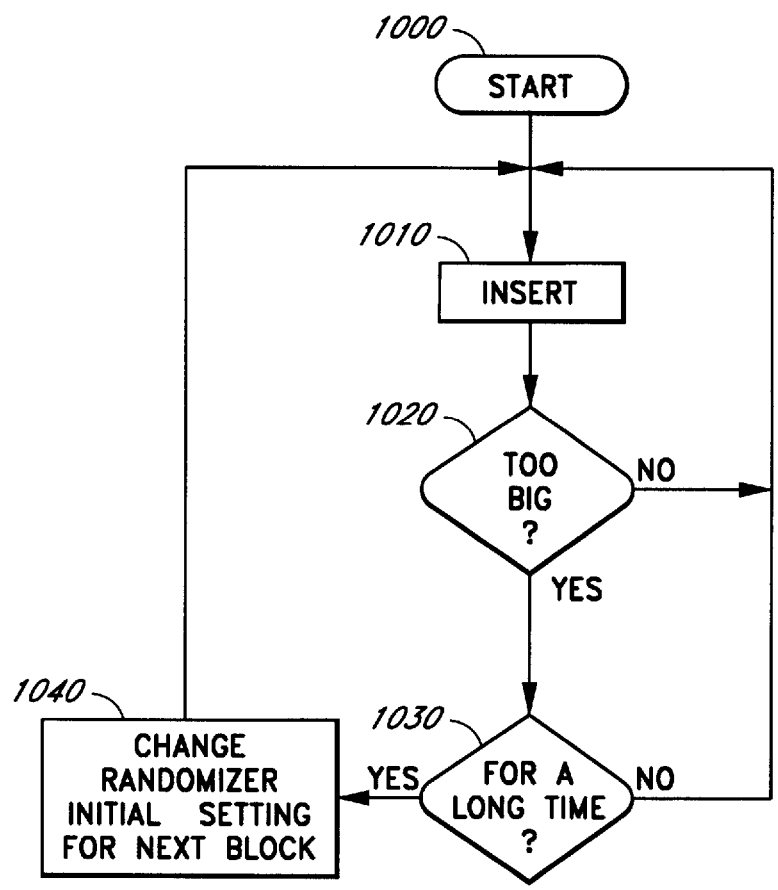
FIG. 10 is a flowchart that illustrates the overall method used in accordance with the present invention to reconfigure the randomizer polynomial when the data storage media written to is a magnetic tape.

FIG. 10 is a flow chart which illustrates the overall method used in accordance with the present invention to reconfigure the randomizer polynomial when the data storage media written to is a magnetic tape. The method initiates as represented within a start block 1000, and thereafter, any bit insertions into the data stream are tabulated as represented within an activity block 1010. If it is determined that the number of insertions for a given data block is within the allowable limits, as represented within a decision block 1020, then the method returns to the activity block 1010 to await the next insertion. However, if it is determined within the decision block 1020 that the number of insertions has exceeded the allowable threshold level, then a further determination is made within a decision block 1030 if the number of insertions is too large for one or more blocks of data. In one advantageous embodiment, one block of data is monitored before it is determined that the number of insertions has been excessive for too long of a time, however two, three or more blocks could also be monitored as called for by the particular application. If a number of insertions has not been excessive for too long of a period, then the method returns to the activity block 1010. However, if it is determined within the decision block 1030 that the number of insertions has been too large for too long of a time, then the randomizer initial settings (i.e., the coefficients to the randomizer polynomial) are changed for the next block as represented within an activity block 1040. The method employed within the activity block 1040 is substantially identical to the method employed within the activity block 940 of FIG. 9.

After the randomizer polynomial coefficients have been changed for the next data block, the method returns to the activity block 1010 to continue monitoring of the number of inserts into the data stream. In this manner, the preferred embodiment ensures that the number of bit insertions into data to be stored onto a magnetic tape does not increase the size of the data to be stored above a tolerable limit (e.g., 1%).

Figure 11:
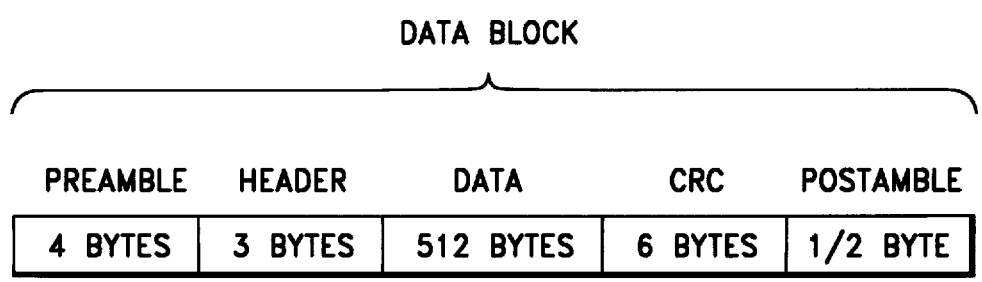
FIG. 11 schematically illustrates the format of a data block in one preferred embodiment of the invention.

FIG. 11 schematically illustrates a format of a data block in one preferred embodiment of the invention. The overall block format is application specific. Each block preferably consists of a series of framed sub-blocks containing an interleaved series of systematic Reed-Solomon code words. Error correction is based primarily on erasures. This is efficient and uses a low bandwidth.

As shown in FIG. 11, each data block includes a preamble, a header, a data portion, a cyclical redundancy check (CRC) portion and a postamble. The preamble typically comprises a four-byte segment which is used to identify the beginning of a new data block, and is advantageously not encoded with the pseudo-noise code so that it is not necessary to know the pseudo-noise code in order to detect the preamble segment. In one actual embodiment, the preamble is "01001100110011001100110011001111."

The header segment contains initialization for the data segment scrambler, as well as other information. It is preferably a three byte sequence which is sent to the shared memory resource by the microcontroller 120 for each 512 bytes data block received by the shared memory resource from the host. The header field therefore preferably consists of the first three bytes received by the encoder from the direct memory access (DMA) channel. Prior to recording, the header is randomized using a fixed randomizer code (i.e., seed). Because the header is randomized using a fixed seed which is always available to the decoder 130, the header randomization may result in a header sequence with poor read characteristics. For instance, the fixed header randomizer may produce a header which contains a long string of zeros. Because re-randomization is unavailable for the header field, it is preferable to use a different encoding scheme for the header field than the data field. For example, the header could be encoded using a fixed ⅘ or ⅚ code. This is less efficient than the variable rate insertion code used on the data block, but it provides a better assurance of readability in the absence of re-randomization. As a preferable alternative, the variable rate bit insertion can be performed on the header, but with different bit insertion thresholds for null sequence length, phase content, and amplitude variations than are utilized when writing the data field to better ensure adequate read characteristics for the header field.

The randomizer initialization is preferably identical for all sub-blocks in a physical frame. Because of read while write error correction, sub-blocks may be associated with a track or frame different from the physical track or frame they are recorded in. Thus, information used to compensate for this effect is included within the header.

The data field contains data which has been encoded using the randomizing polynomial. This data field includes the last 512 bytes from the DMA channel. In one advantageous embodiment, randomization of the data involves exclusive OR-ing the data with the least significant bit of the 24-bit randomizing polynomial discussed above according to a method which is well known in the art.

The CRC segment advantageously comprises a six byte field calculated from the preceding header and data fields after the randomization. This sub-block is never randomized and allows a sub-block to be validated without knowledge of the randomizer initialization. In one preferred embodiment, the polynomial used to calculate the CRC field is:

$$g(x)=x^{48}+x^{46}+x^{44}+x^{42}+x^{36}+x^{34}+x^{33}x^{32}+x^{31}+x^{30}+x^{28}+x^{26}+x^{25}+x^{24}++x^{23}+x^{22}+x^{21}+x^{20}+x^{19}+x^{17}+x^{13}+x^{10}+x^{9}30\ x^{6}+x^{4}+x^{2}+x+1$$

The postamble field advantageously comprises a four-bit pattern such as 0101.

Figure 12A:
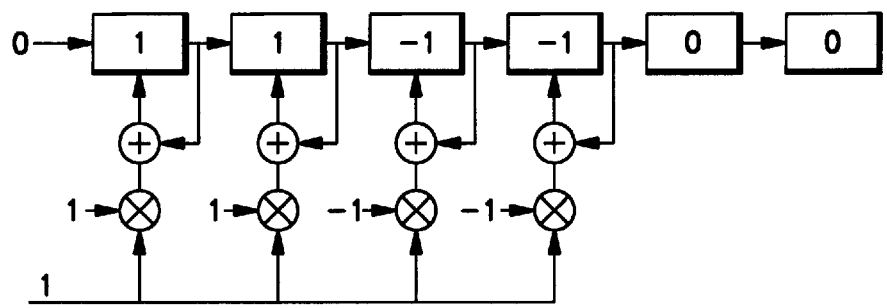
Figure 12B:
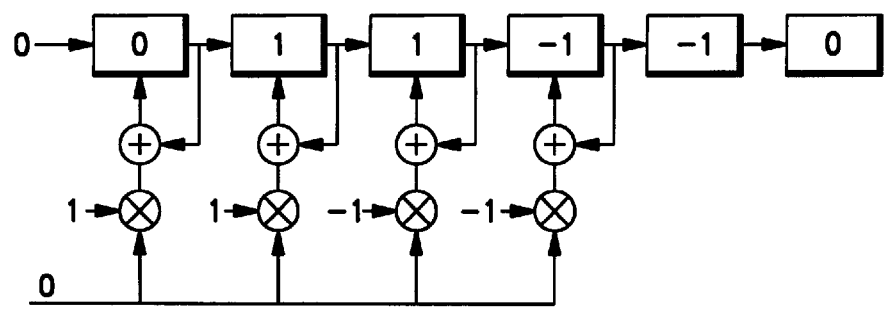
Figure 12C:
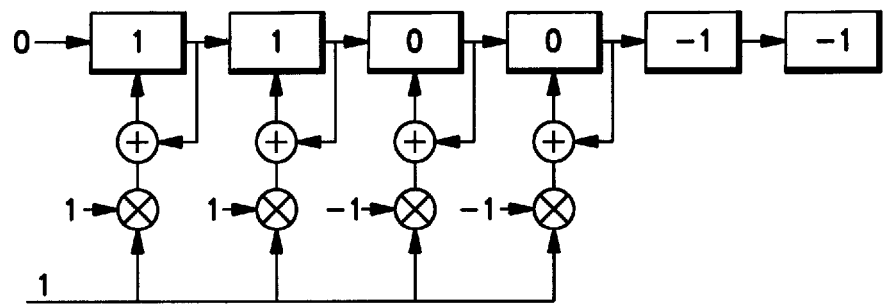
Figure 12D:
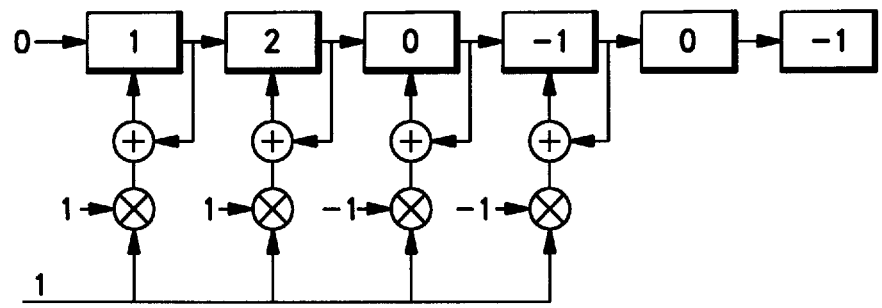

FIGS. 12–12d schematically illustrate the method used within a convolutional encoder to simulate the read head impulse response in order to determine the null, phase, and AGC metrics. In order to determine whether or not the read head used to read the data from the magnetic media is receiving sufficient amplitude and phase information, it is important to simulate the effects of the read head using a partial response simulation method. In the particular implementation used in the preferred embodiment, the extended partial response, class 4 (EPR4) is simulated since the simulation using this method is closest to the actual response observed in the read head used in the preferred embodiment.

As depicted in FIG. 12, a data stream is input into a parallel multiplier circuit wherein each bit of the data stream is simultaneously multiplied by either a positive one or a negative one. As depicted in FIG. 12, a bit from the data stream is multiplied by a positive 1 and then added to the value within a register $R_0$, while the same bit is multiplied by 1 and added to the value stored within a register element $R_1$. The same data bit is also multiplied by a −1 to be added to the value stored within the register elements $R_2$ and $R_3$, respectively. Upon each clock cycle, the value stored within the shift register elements are shifted over by 1 bit so that a convolutional encoding is performed to simulate the read head impulse response.

For example, as depicted in FIG. 12a–12d, assuming that the register elements $R_0$–$R_5$ are initialized to 0, when the first bit in the data stream is received, register elements $R_0$–$R_5$ will respectively have values of 1, 1, −1, −1, 0, and 0, as depicted in FIG. 12a. Subsequently, the values within the shift register elements $R_0$–$R_5$ are shifted by one element so that $R_0$ is equal to 0, $R_1$ is equal to 1, $R_2$ is equal to 1, $R_3$ is equal to −1, $R_4$ is equal to −1, and $R_5$ is equal to 0.

Thereafter, when the next data bit in the data stream is applied, (e.g., a 0 as shown in FIG. 12b), this value is multiplied by the appropriate multiplier value and added to the value stored within the shift register elements $R_0$–$R_5$. Because the data stream value is 0 as shown in the example of FIG. 12b, this does not change the value of any of the bits stored within the shift register elements $R_0$–$R_5$.

However, in the next clock cycle the data bits are shifted once again and the next bit in the data stream is then multiplied by the appropriate multiplier values and added to the respective values within the shift register elements $R_0$–$R_3$. As depicted in FIG. 12c, when a 1 is applied in the next clock cycle, this causes a value of 1 to be added to the 0 value stored within the shift register element $R_0$, while a value of 1 is also added to the 0 value stored within the shift register element $R_1$. Furthermore, values of −1 are added to the values stored within the shift register elements $R_2$ and $R_3$ thereby resulting in a net 0 value to be stored within the shift register elements $R_2$ and $R_3$. Finally, the shift register elements $R_4$ and $R_5$ include the shifted values of −1 and −1, respectively.

Once again, these values are shifted by one element (so that $R_0$–$R_5$ are now equal to 0, 1, 1, 0, 0, −1, respectively) and the next bit in the data stream is multiplied by the appropriate factor and added to the shift register elements $R_0$–$R_3$. The subsequent multiplication and addition to the value stored within the shift register elements $R_0$–$R_3$ results in values of 1, 2, 0, −1, 0, and −1 to be stored within the shift register elements $R_0$–$R_5$, respectively.

As will be appreciated from the above-described method, whenever a long stream of consecutive zeros is input as the data stream, this will eventually cause the register value of $R_3$ to assume a value of 0 for an extended number of clock cycles. Thus, the value stored within register $R_3$ is indicative of a null within the data stream. Furthermore, it will also be appreciated that the value of $R_3$ is indicative of gain content so that the value of $R_3$ will become a +2 or a −2 whenever a large amplitude variation is observed in the data stream. Thus, whenever a value of 2 or −2 has not appeared within the register element $R_3$ for an extended period of time, this indicates that the data stream is devoid of amplitude information so that a bit pattern which adds amplitude information must be inserted as described above. Finally, it will be appreciated that since the value stored within register element $R_5$ is simply a time delayed version of the value stored within register element $R_3$, the difference between the value stored within the register elements $R_3$ and $R_5$ taken during the same clock cycle will be indicative of the "slope" of the impulse response produced by the data stream at time $R_4$. Thus, the difference between the value stored within the register element $R_5$ and the value stored within the register element $R_3$ is a measure of the phase content, where a large difference indicates a high phase content and a small difference indicates a low phase content.

Although the preferred embodiment has been described in detail above, it will be appreciated by one of ordinary skill in the art that certain obvious modifications could be made in the preferred embodiment without departing from the spirit or central characteristics of the invention. For example, the insertion counter could be implemented as a device which monitors overall block size or the ratio of inserted bits to non-inserted bits. Therefore the scope of the invention should be interpreted in light of the following appended claims.

What is claimed is:

1. An apparatus for error encoding a digital data stream to be stored onto a data storage medium, said apparatus comprising:

a data stream input terminal configured to receive an input data stream; monitoring device which monitors said data stream to determine if a bit insertion is to be performed;

a bit inserter which inserts one or more bits into said data stream, at a rate which varies depending on said input data stream content, after said code monitoring device determines that a bit insertion is to be performed thereby producing an encoded output data stream; and a write head configured to receive said encoded output data stream and to write said encoded data stream onto said data storage medium.

2. An apparatus as defined in claim 1, wherein said bit inserter inserts a multiple bit word that encodes maximum phase information.

3. An apparatus as defined in claim 2, wherein said inserted multiple bit word also encodes maximum amplitude information.

4. An apparatus as defined in claim 1, wherein said bit inserter inserts a multiple bit word that encodes maximum amplitude information.

5. An apparatus as defined in claim 1, wherein said bit inserter inserts a four bit word.

6. An apparatus as defined in claim 1, wherein said digital data stream is written to said data storage medium in association with a determined preamble sequence;

wherein said code monitoring device monitors said digital data stream to determine if said digital data stream comprises a subset of said preamble sequence; and, wherein said bit inserter inserts a bit at one end of said subset of said preamble sequence.

7. A method of error encoding a digital data stream to be stored onto a data storage medium, said method comprising the steps of:

inputting a data stream;

monitoring said data stream to determine if a bit insertion is to be performed;

inserting one or more multiple bit words at a rate which varies depending on data stream content into said data stream when said bit insertion is to be performed; and storing said data stream onto said data storage medium.

8. A method as defined in claim 7, wherein said step of inserting includes the step of inserting a multiple bit word that encodes maximum phase information.

9. A method as defined in claim 8, wherein said inserted multiple bit word further encodes maximum amplitude information.

10. A method as defined in claim 7, wherein said step of inserting includes the step of inserting a multiple bit word that encodes maximum amplitude information.

11. A method as defined in claim 7, wherein said multiple bit word comprises a four bit word.

12. A method of storing data on data storage media comprising:

receiving an input data stream;

estimating a read channel response to said input data stream;

inserting one or more multiple bit words into said input data stream in response to said estimating to produce an output data stream, wherein said multiple bit words are selected to produce a read channel response of greater magnitude than that produced by said input data stream without said multiple bit word inserted; and storing said output data stream onto said data storage media.

13. The method of claim 12, wherein said estimating comprises estimating the response of an Extended Class 4 Partial Response read channel, and wherein said inserting one or more multiple bit words comprises inserting the word "0011" at one or more locations in said input data stream.

14. An apparatus for error encoding a digital data stream comprising:

a data stream input terminal configured to receive an input data stream;

a read channel response estimator configured to monitor said input data stream and to produce an output signal when a read channel response to said input data stream is estimated to contain one or more predetermined characteristics;

a variable rate bit inserter which inserts one or more bits into said input data stream in response to said read channel response estimator output signal.

* * * * *